(12) United States Patent
Takizawa

(10) Patent No.: US 7,847,352 B2
(45) Date of Patent: Dec. 7, 2010

(54) SEMICONDUCTOR DEVICE AND METHOD FOR MANUFACTURING THE SAME

(75) Inventor: Teruo Takizawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 177 days.

(21) Appl. No.: 11/624,081

(22) Filed: Jan. 17, 2007

(65) Prior Publication Data
US 2007/0164318 A1    Jul. 19, 2007

(30) Foreign Application Priority Data
Jan. 18, 2006  (JP) ............................ 2006-009585

(51) Int. Cl.
*H01L 23/62* (2006.01)
(52) U.S. Cl. .............................. 257/347; 257/E29.126; 438/370
(58) Field of Classification Search ................. 257/347, 257/E29.126; 438/370
See application file for complete search history.

(56) References Cited

U.S. PATENT DOCUMENTS 6,664,146 B1 * 12/2003 Yu .............................. 438/149

2003/0075758 A1 *  4/2003  Sundaresan et al. .......... 257/329
2003/0183883 A1 * 10/2003  Shimizu et al. .............. 257/390

FOREIGN PATENT DOCUMENTS

| JP | A-05-129536 | 6/1993 |
| JP | A-06-163677 | 6/1994 |
| JP | A 2000-124092 | 4/2000 |
| JP | A 2002-299591 | 10/2002 |

OTHER PUBLICATIONS

T, Sakai et al., "Separation by Bonding Si Islands (SBSI) for LSI Applications," Second International SiGe Technology and Device Meeting, Meeting Abstract, pp. 230-231, May 2004.

* cited by examiner

*Primary Examiner*—Thao X Le
*Assistant Examiner*—Matthew Gordon
(74) *Attorney, Agent, or Firm*—Oliff & Berridge, PLC

(57) ABSTRACT

A semiconductor device includes: a semiconductor layer formed on a semiconductor substrate by performing epitaxial growth; a first buried insulating layer which is buried in the first region under the semiconductor layer; and a second buried insulating layer which is buried in the second region under the semiconductor layer in the position lower than the first buried insulating layer.

4 Claims, 15 Drawing Sheets

SEMICONDUCTOR DEVICE AND METHOD FOR MANUFACTURING THE SAME

BACKGROUND OF THE INVENTION

1. Technical Field

The present invention relates to a semiconductor device and a method for manufacturing the same, in particular to a semiconductor which is suitably applied to a filed effect transistor formed on a Silicon On Insulator (SOT) substrate.

2. Related Art

The utility of field effect transistors formed on a SOI substrate is attracting attention due to easiness of element isolation, characteristic of latch-up free, small source/drain junction capacitances etc. In particular, since fully depleted type SOI transistors can be operated with low power consumption and at high speeds, researches on operating SOI transistors in a completely depleted mode are actively conducted. It should be noted that, as a SOI substrate, for example, a Separation by Implanted Oxygen (SIMOX) substrate, a laminated substrate or the like may be used, as described in JP-A-2002-299591 and JP-A-2000-124092.

Further, JP-A-2002-299591 discloses a method for forming a SOI transistor at a low cost by forming a SOI layer on a bulk substrate. According to the method disclosed in JP-A-2002-299591, a Si/SiGe layer is formed on a Si substrate, and only a SiGe layer is selectively removed by utilizing the difference in selectivity between Si and SiGe, thereby forming a void portion between the Si substrate and the Si layer. Then, by performing thermal oxidation of Si exposed into the void portion, a $SiO_2$ layer is embedded between the Si substrate and the Si layer and a BOX layer is formed between the Si substrate and the Si layer.

However, in order to manufacture a SIMOX substrate, highly concentrated oxygen needs to be ion-implanted in a silicon wafer. Further, in order to manufacture a bonded wafer, two silicon wafers need to be bonded together, and then the surface of the silicon wafer needs to be polished. For this reason, there is a problem in that the cost of SOI transistors increases compared to field effect transistors that are formed in bulk semiconductor.

Furthermore, there is a problem in that the ion implantation and polishing cause a large variation in film thickness of a SOI layer, so it becomes difficult to stabilize the characteristics of field effect transistors when the SOI layer is made into a thin film for manufacturing fully depleted type SOT transistors.

Moreover, as disclosed in T. Sakai et al. "Separation by Bonding Si Islands (SBSI) for LSI Application", Second International SiGe Technology and Device Meeting, Meeting Abstract, pp. 230-231, May (2004), the film thickness of the SOT layer on the BOX layer is uniform, so there arises a problem in that the drain breakdown voltage may be deteriorated or electrostatic breakdown level may become lower when the film thickness of the SOI layer in a channel region is made to be thinner in order to obtain a steep subthreshold slope. On the other hand, when the film thickness of the SOI layer in the channel region is thicker in order to ensure the drain breakdown voltage, a subthreshold slope of the drain current are deteriorated, which becomes a hindrance to a low voltage operation of transistors and leads to increase in leakage current in OFF condition, thereby increasing power consumption of the device while operating or waiting.

SUMMARY

An advantage of the present invention is to provide a semiconductor device in which semiconductor layers having different film thickness can be formed on an insulating layer without using different SOI substrates, and to provide a method for manufacturing a semiconductor device.

A semiconductor device according to one aspect of the invention includes a semiconductor layer formed on a semiconductor substrate by performing epitaxial growth; a first buried insulating layer which is buried in the first region on the semiconductor substrate; and a second buried insulating layer which is buried in the second region above the semiconductor substrate in lower position than the first buried insulating layer.

By this, it becomes possible to make the depth of the buried insulation layer arranged under the semiconductor layer in the different regions on the same semiconductor substrate. Therefore, it is possible to form semiconductor layers having different film thickness on the insulating layer without using different SOI substrates, thereby making it possible to achieve reduction in cost of transistors and to place on the same chip SOI transistors which correspond to the applications of low voltage driving, low power consumption, high breakdown voltage, high speed and the like in a mixed manner.

Further, in this case, the semiconductor device may further include isolation fields which work for horizontal isolation between semiconductor devices on the first buried insulating layer and semiconductor devices on the second buried insulating layer.

By this, even when semiconductor layers having different film thickness are formed on each insulating layer, it becomes possible to isolate semiconductor devices from the other semiconductor devices which have different film thickness, thereby making it possible to fabricate different types of SOI transistors which correspond to the applications of low voltage driving, low power consumption, high breakdown voltage, high speed and the like in a mixed manner.

According to an aspect of the present invention, a semiconductor device includes a first semiconductor layer formed on a semiconductor substrate by performing epitaxial growth; a second semiconductor layer formed on the first semiconductor layer by performing epitaxial growth; a first buried insulating layer which is buried in a first region between the semiconductor substrate and the first semiconductor layer; and a second buried insulating layer which is buried in a second region between the first semiconductor layer and the second semiconductor layer.

By this, it is possible to stack the second semiconductor layer on the second buried insulating layer while stacking the first semiconductor layer and the second semiconductor layer on the first buried insulating layer. Therefore, it becomes possible to form semiconductor layers having different film thickness on the insulating layer without using different SOI substrates, thereby making it possible to achieve reduction in cost of the transistors and to fabricate different types of SOI transistors which correspond to the applications of low voltage driving, low power consumption, high breakdown voltage, high speed and the like in a mixed manner.

In this case, the semiconductor device may further include horizontal isolation fields which work for isolation between the first and second semiconductor layers on the first buried insulating layer and the second semiconductor layer on the second buried insulating layer.

By this, it becomes possible to stack the first semiconductor layer and the second semiconductor layer on the first buried insulating layer. Further, also when the second semiconductor layer is stacked on the second buried insulating layer, it becomes possible to isolate the first and second semiconductor layers stacked on the first buried insulating layer from the second semiconductor layer stacked on the second buried insulating layer, thereby making it possible to fabricate different types of SOI transistors which correspond to the applications of low voltage driving, low power consumption, high breakdown voltage, high speed and the like in a mixed manner.

A method for manufacturing a semiconductor device according to an aspect of the present invention includes: forming a first semiconductor layer partially on a semiconductor substrate; forming a second semiconductor layer having slower etching rate than that of the first semiconductor layer so as to cover the first semiconductor layer and the semiconductor substrate; forming partially a third semiconductor layer having faster etching rate than that of the second semiconductor layer and being apart from the first semiconductor layer; forming a fourth semiconductor layer having slower etching rate than that of the third semiconductor layer so as to cover the third semiconductor layer and the second semiconductor layer; exposing at least a portion of the first semiconductor layer from the second and the fourth semiconductor layers and forming a exposure portion that exposes at least a portion of the third semiconductor layer from the fourth semiconductor layer; forming a first void portion and a second void portion from which the first semiconductor layer and the third semiconductor layer are selectively removed by selectively etching the first semiconductor layer and the third semiconductor layer thorough the exposure portion; and forming a first buried insulating layer and a second buried insulating layer respectively instead of the first void portion and the second void portion.

By this, the second and the fourth semiconductor layers are laminated on the first semiconductor layer, and even when the fourth semiconductor layer is laminated on the third semiconductor layer, it becomes possible to make etching solution or etching gas to contact with the first and third semiconductor layers through an exposure part. Further, it is possible to remove the first and the third semiconductor layers while the second and the fourth semiconductor layers remain. Furthermore, it becomes possible to form a first buried insulating layer and a second buried insulating layers respectively which are formed instead of the first and the second void portions respectively under the second and the fourth semiconductor layers.

Therefore, it becomes possible to stack the second and the fourth semiconductor layers respectively on the first and the second buried insulating layers while suppressing the generation of the defects in the second and the fourth semiconductor layers. Further, it becomes possible to form semiconductor layers having different film thickness on each buried insulating layer without using different SOI substrates. Therefore, it is possible to achieve reduction in cost of semiconductor devices and to fabricate different types of SOI transistors which correspond to the applications of low voltage driving, low power consumption, high breakdown voltage, high speed and the like in a mixed manner.

In this case, the method for manufacturing a semiconductor device may further include: forming a groove extending through step of the second semiconductor layer and the fourth semiconductor layer formed on a boundary between the first semiconductor layer and the third semiconductor layer so as to expose the semiconductor substrate; and forming a supporting layer that supports the second semiconductor layer and the fourth semiconductor layer above the semiconductor substrate.

By this, even when the first and the second void portions are respectively formed under the second and the fourth semiconductor layers, it is possible to support the second and the fourth semiconductor layers above the semiconductor substrate while etching steps of the first and the third semiconductor layer, thereby making it possible to isolate the second and the fourth semiconductor layers from the semiconductor substrate while suppressing the generation of the defects in the second semiconductor layer and the fourth semiconductor layer.

In this case, the semiconductor substrate, the second semiconductor layer and the fourth semiconductor layer may be Si, and the first semiconductor layer and the third semiconductor layer may be SiGe.

By this, it becomes possible to make the etching rate of the first and the third semiconductor layers faster than that of the semiconductor substrate, the second and the fourth semiconductor layers while making it possible to achieve lattice matching from the semiconductor substrate to the fourth semiconductor layers. Therefore, it becomes possible to form the second and the fourth semiconductor layers having good crystalline qualities respectively on the first and the third semiconductor layers, thereby making it possible to isolate the second and the fourth semiconductor layers from the semiconductor substrate without impairing the qualities of the second and the fourth semiconductor layers.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a method for manufacturing a semiconductor device in accordance with an embodiment of the present invention will be described with reference to the accompanying drawings.

FIGS. 1A-14A are plane views illustrating a method for manufacturing a semiconductor device in accordance with an embodiment of the present invention, FIGS. 1B-14B are cross-sectional views respectively taken along the lines A1-A1' to A14-A14' of FIG. 1A-14B, and FIGS. 1C-14C are cross-sectional views respectively taken along the lines B1-B1' to B14-B14' of FIG. 1A-14A.

Figure 1A:
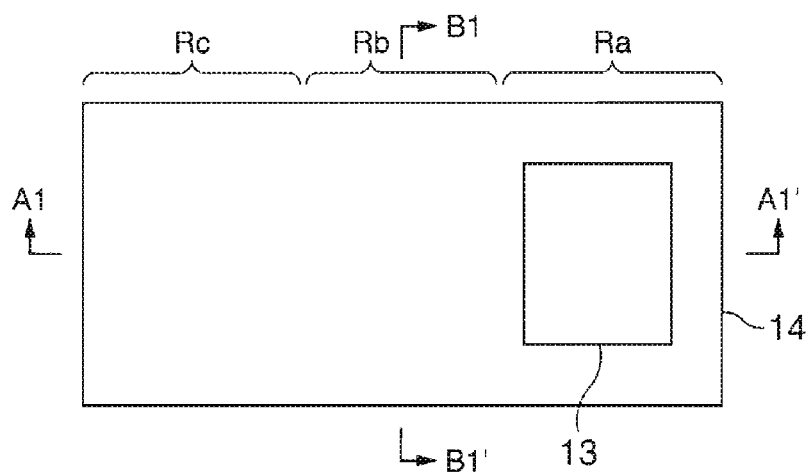
FIGS. 1A-1C are views illustrating a method for manufacturing a semiconductor device according to an embodiment of the present invention.
Figure 1B:
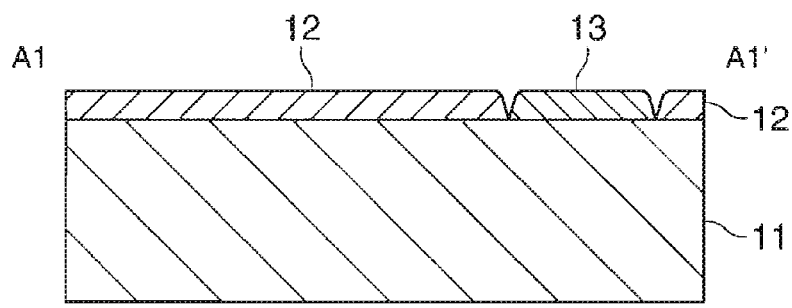
Figure 1C:
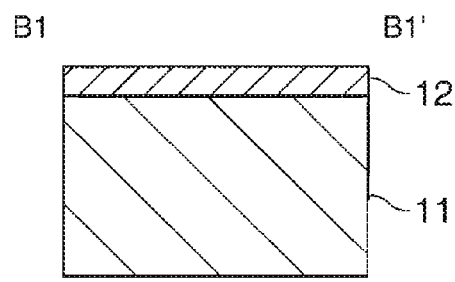

Referring to FIGS. 1A to 1C, a first region Ra, a second region Rb and a third region Rc are formed on a semiconductor substrate 11. Then, an oxide film 12 is formed by thermal oxidation of the semiconductor substrate 11 or a method such as CVD. After that, the oxide film 12 is patterned by utilizing photo-lithography technique and etching technique, thereby forming on the oxide film 12 an aperture portion exposing the first region Ra on the semiconductor substrate 11. Then, by utilizing a selective epitaxial growth using as a mask the oxide film 12 having the aperture portion formed thereon, a semiconductor layer 13 is formed in the first region Ra on the semiconductor substrate 11.

Figure 2A:
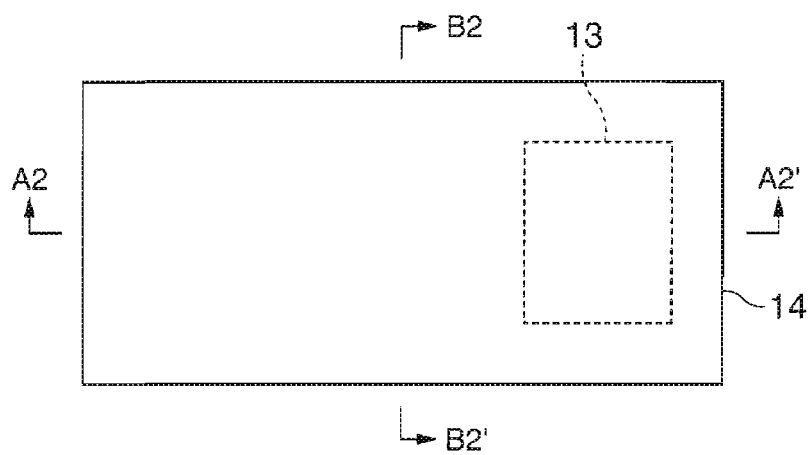
FIGS. 2A-2C are views illustrating a method for manufacturing a semiconductor device according to an embodiment of the present invention.
Figure 2B:
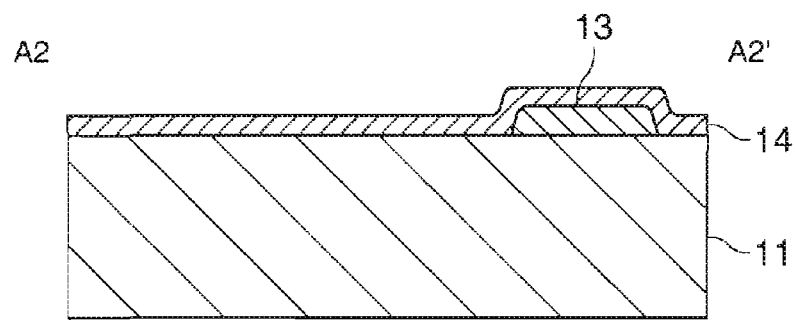
Figure 2C:
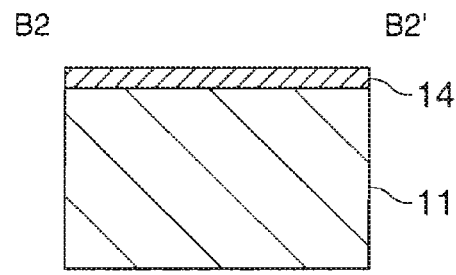

Next, as shown in FIGS. 2A-2C, the oxide film 12 is removed from the semiconductor substrate 11, and then an epitaxial growth is used to thereby form a second semiconductor layer 14 on the semiconductor substrate 11 so that the first semiconductor layer 13 is covered.

Figure 3A:
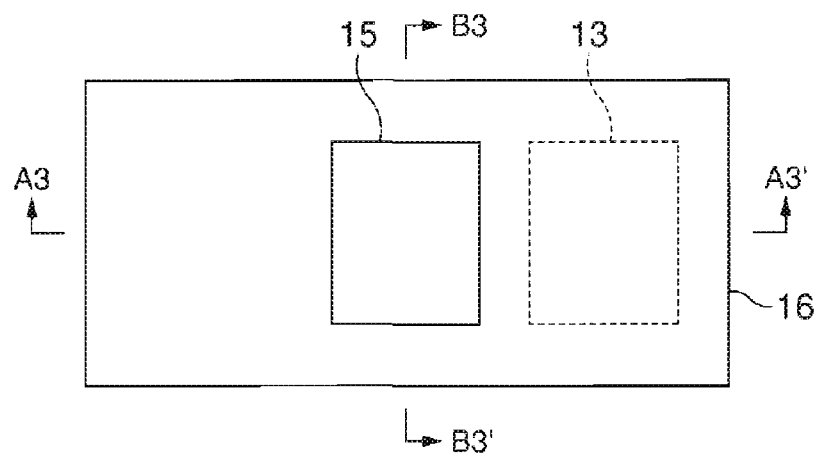
FIGS. 3A-3C are views illustrating a method for manufacturing a semiconductor device according to an embodiment of the present invention.
Figure 3B:
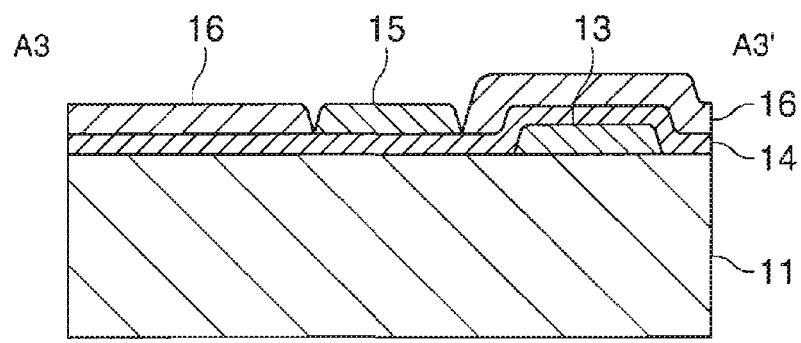
Figure 3C:
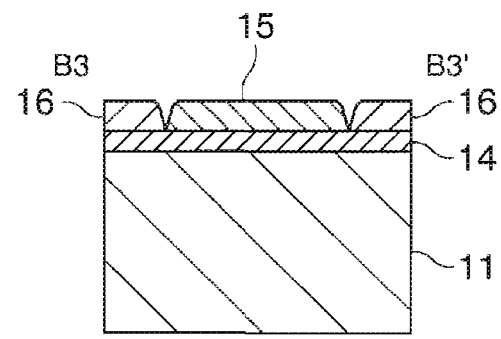

After that, as shown in FIGS. 3A-3C, an oxide film 16 is formed on the second semiconductor layer 14 by thermal oxidation of the second semiconductor layer 14 or a method such as CVD. Then, the oxide film 16 is patterned by utilizing photo-lithography technique and etching technique, thereby forming on the oxide film 16 an aperture portion exposing the second region Rb on the second semiconductor layer 14. After that, by utilizing a selective epitaxial growth using as a mask the oxide film 16 having the aperture portion formed thereon, a third semiconductor layer 15 is formed in the second region Rb on the second semiconductor layer 14.

Figure 4A:
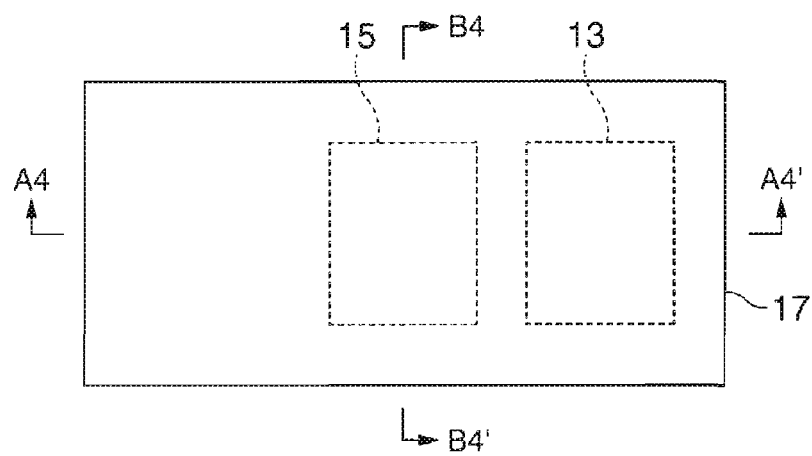
FIGS. 4A-4C are views illustrating a method for manufacturing a semiconductor device according to an embodiment of the present invention.
Figure 4B:
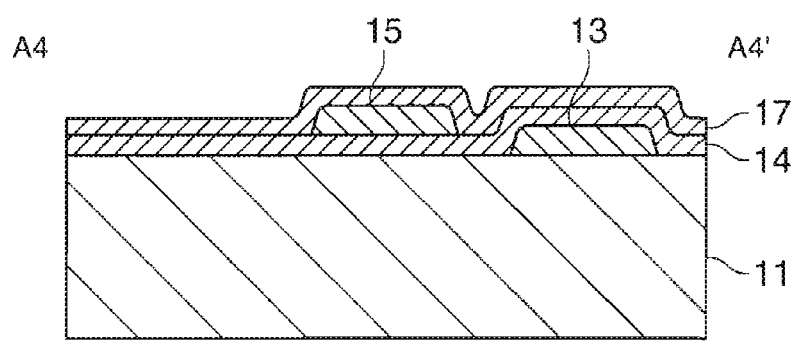
Figure 4C:
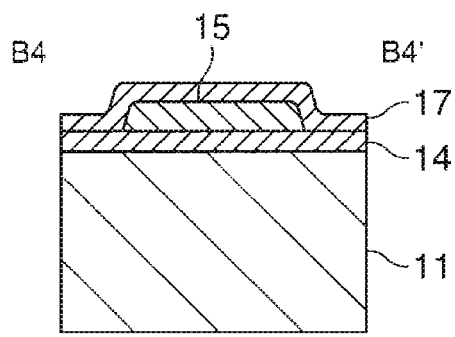

Next, as shown in FIGS. 4A-4C, the oxide film 16 is removed from the second semiconductor layer 14, and then an epitaxial growth is used, thereby forming a fourth semiconductor layer 17 on the second semiconductor layer 14 so that the third semiconductor layer 15 is covered.

Figure 5A:
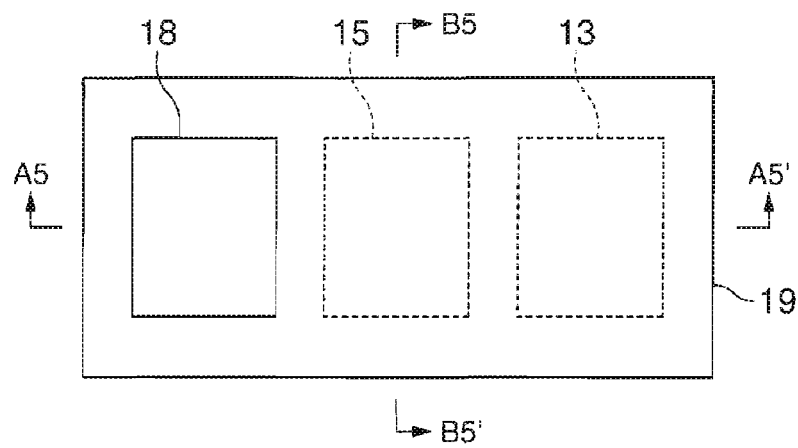
FIGS. 5A-5C are views illustrating a method for manufacturing a semiconductor device according to an embodiment of the present invention.
Figure 5B:
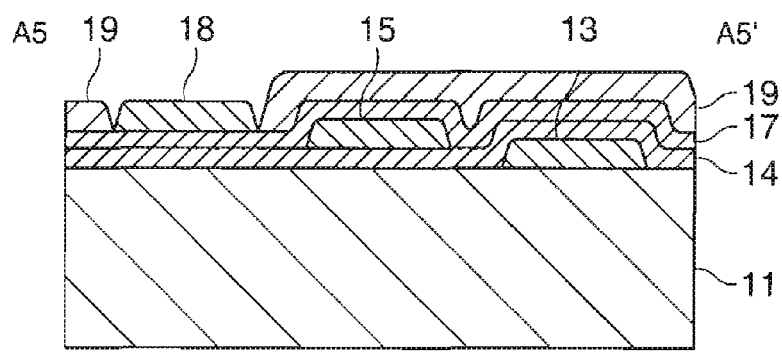
Figure 5C:
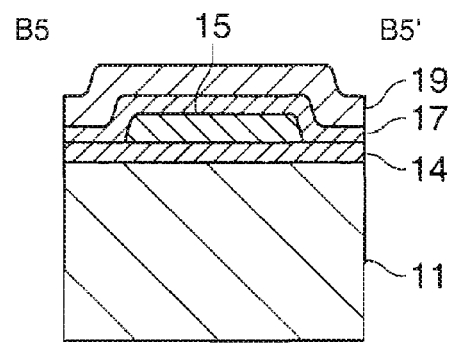

After that, as shown in FIGS. 5A-5C, an oxide film 19 is formed on the fourth semiconductor layer 17 by thermal oxidation of the fourth semiconductor layer 17 or a method such as CVD. Then, the oxide film 19 is patterned by using photo-lithography technique and etching technique, thereby forming on the oxide film 19 an aperture portion exposing the third region Rc on the fourth semiconductor layer 17. Next, by utilizing a selective epitaxial growth using as a mask the oxide film 19 having the aperture portion formed thereon, a fifth semiconductor layer 18 is formed in the third region Rc on the fourth semiconductor layer 17.

Figure 6A:
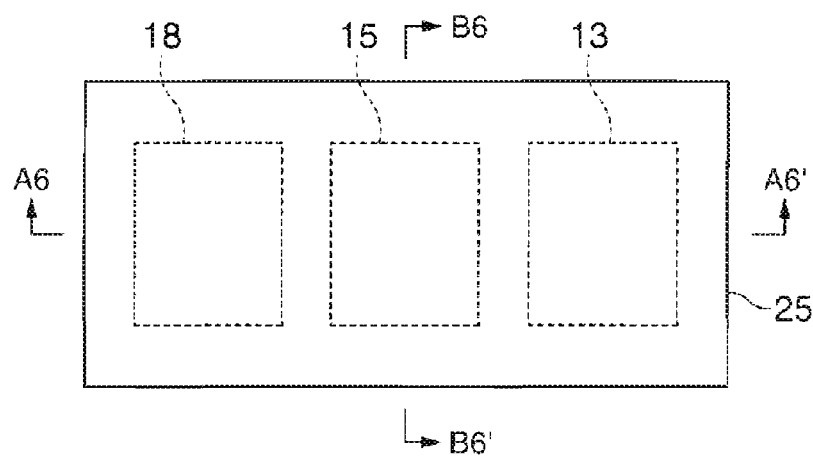
FIGS. 6A-6C are views illustrating a method for manufacturing a semiconductor device according to an embodiment of the present invention.
Figure 6B:
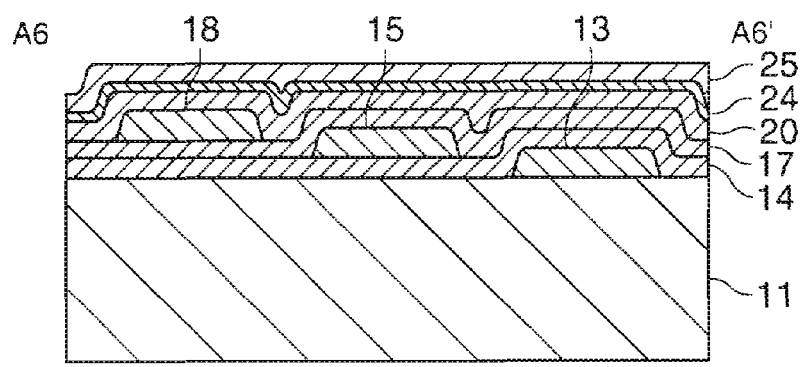
Figure 6C:
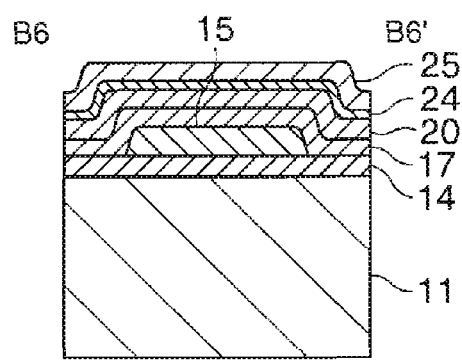

Next, as shown in FIGS. 6A-6C, the oxide film 19 is removed from the fourth semiconductor layer 17, and then an epitaxial growth is used, thereby forming on the fourth semiconductor layer 17 a sixth semiconductor layer 20 so that the fifth semiconductor layer 18 is covered.

It should be noted that it is possible to use as materials for the first semiconductor layer 13, the third semiconductor layer 15 and the fifth semiconductor layer 18 materials having faster etching rates than those for the semiconductor substrate 11, the second semiconductor layer 14, the fourth semiconductor layer 17 and the sixth semiconductor layer 20. It is further possible to use as materials for the semiconductor substrate 11, the first semiconductor layer 13, the second semiconductor layer 14, the third semiconductor layer 15, the fourth semiconductor layer 17, the fifth semiconductor layer 18 and the sixth semiconductor layer 20 the combination selected from, for example, Si, Ge, SiGe, SiC, SiSn, PbS, GaAs, InP, GaP, GaN, ZnSe and the like. In particular, when the semiconductor substrate 11 is made from Si, it is preferable to use SiGe for the first semiconductor layer 13, the third semiconductor layer 15, the fifth semiconductor layer 18 and Si for the second semiconductor layer 14, the fourth semiconductor layer 17 and the sixth semiconductor layer 20. By this, it becomes possible to achieve lattice matching between the semiconductor substrate 11, the first semiconductor layer 13, the second semiconductor layer 14, the third semiconductor layer 15, the fourth semiconductor layer 17, the fifth semiconductor layer 18 and the sixth semiconductor layer 20. At the same time, it becomes also possible to ensure the selective etching of the first semiconductor layer 13, the third semiconductor layer 15 and the fifth semiconductor layer 18 while keeping the second semiconductor layer 14, the fourth semiconductor layer 17 and the sixth semiconductor layer 20 remained. Further, for the first semiconductor layer 13, the third semiconductor layer 15 and the fifth semiconductor layer 18, not only a single crystal semiconductor layer but also a polycrystalline semiconductor layer, an amorphous semiconductor layer or a porous semiconductor layer may be used. Further, instead of using the first semiconductor layer 13, the third semiconductor layer 15 and the fifth semiconductor layer 18, it is also possible to use a metal oxide film such as a y-aluminum oxide on which a single crystal semiconductor layer can be formed by epitaxial growth. Furthermore, the film thickness of the first semiconductor layer 13, the second semiconductor layer 14, the third semiconductor layer 15, the fourth semiconductor layer 17, the fifth semiconductor layer 18 and the sixth semiconductor layer 20 are not necessarily the same, but the film thickness of the first semiconductor layer 13, the second semiconductor layer 14, the third semiconductor layer 15, the fourth semiconductor layer 17, the fifth semiconductor layer 18 and the sixth semiconductor layer 20 may be different from each other. Here, by setting the film thickness of the first semiconductor layer 13, the third semiconductor layer 15 and the fifth semiconductor layer 18 to be different form each other, it becomes possible to make the film thickness of buried oxide layers each formed in the second region Rb and the third region Rc different from each other. It should be noted that the film thickness of the first semiconductor layer 13, the second semiconductor layer 14, the third semiconductor layer 15, the fourth semiconductor layer 17, the fifth semiconductor layer 18 and the sixth semiconductor layer 29 may be, for example, ca. 10-200 nm.

Then, a foundation oxide film 24 is formed on the surface of the sixth semiconductor layer 20 by thermal oxidation of the sixth semiconductor layer 20. After that, an oxidation resistant film 25 is formed on the entire foundation oxide film 24 by using a method such as CVD. It should be noted that as the oxidation resistant film 25 a silicon nitride film, for example, can be used so that it can also serve as a stopper layer for a planarization technology by a chemical mechanical polishing (CMP) besides providing protection against oxidation for the sixth semiconductor layer 20.

Figure 7A:
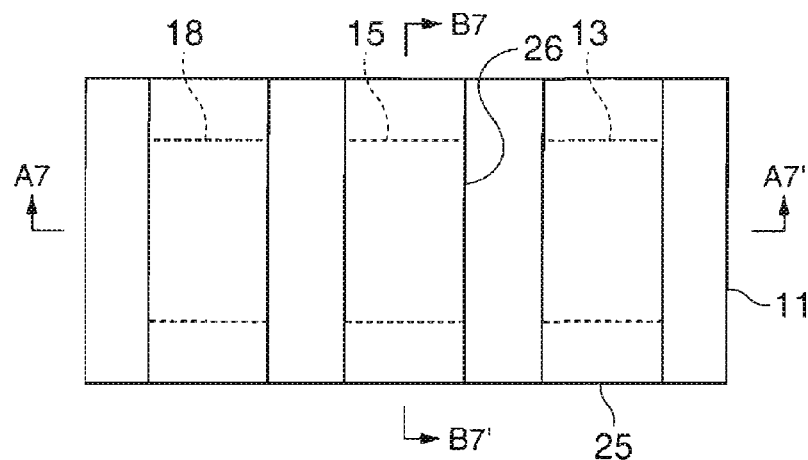
FIGS. 7A-7C are views illustrating a method for manufacturing a semiconductor device according to an embodiment of the present invention.
Figure 7B:
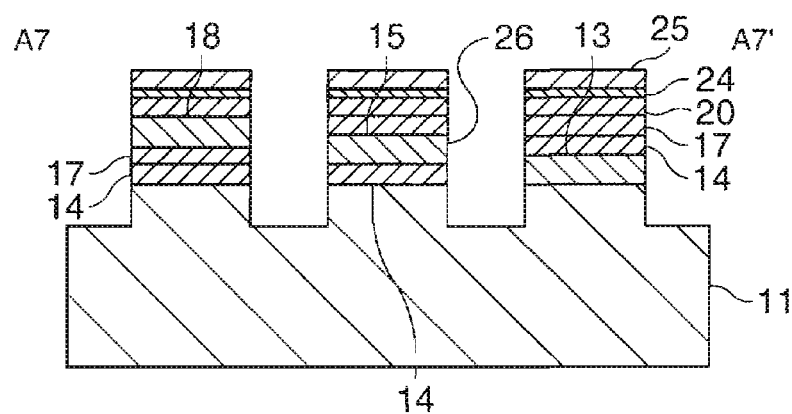
Figure 7C:
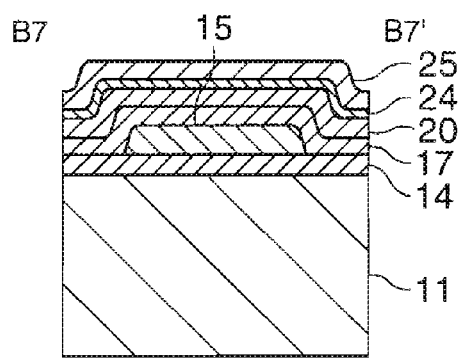

Next, as shown in FIGS. 7A-7C, by patterning the oxidation resistant film 25, the foundation oxide film 24, the first semiconductor layer 13, the second semiconductor layer 14, the third semiconductor layer 15, the fourth semiconductor layer 17, the fifth semiconductor layer 18 and the sixth semiconductor layer 20, a groove 26 is formed which is arranged so as to overlap the ends of the first semiconductor layer 13, the third semiconductor layer 15 and the fifth semiconductor layer 18 and exposes a part of the semiconductor substrate 11. It should be noted that when exposing a part of the semiconductor substrate 11, it is possible to stop etching process at the surface of the semiconductor substrate 11 or form a concave portion in the semiconductor substrate 11 by over etching the semiconductor substrate 11. Further, the arrangement portion of the groove 26 may correspond to a part of an isolation field region between the second semiconductor layer 14, the fourth semiconductor layer 17 and the sixth semiconductor layer 20 in each region of Ra, Rb, and Rc respectively. Furthermore, the groove 26 is preferably arranged so as to remove steps of the second semiconductor layer 14, the fourth semiconductor layer 17 and the sixth semiconductor layer 20 which are adjacent to the boundary of the first semiconductor layer 13, the third semiconductor layer 15 and the fifth semiconductor layer 18.

Figure 8A:
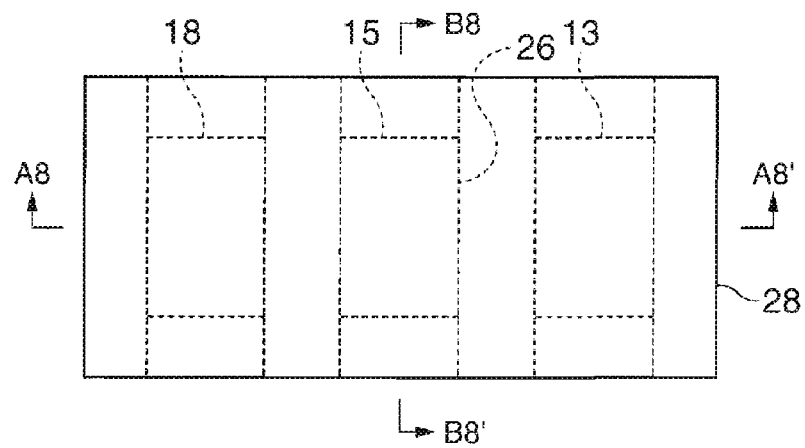
FIGS. 8A-8C are views illustrating a method for manufacturing a semiconductor device according to an embodiment of the present invention.
Figure 8B:
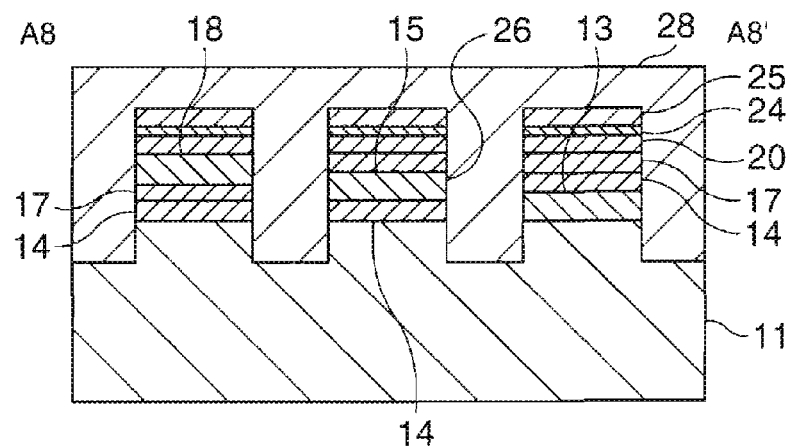
Figure 8C:
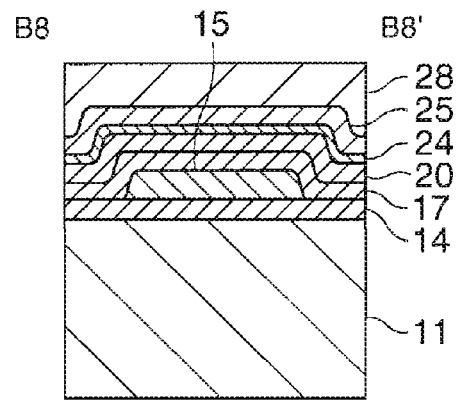

Next, as shown in FIGS. 8A-8C, a supporting layer 28 embedded in the groove 26 is formed so as to cover the entire substrate by a method such as CVD. It should be noted that the supporting layer 28 is also formed on the side walls of the first semiconductor layer 13, the second semiconductor layer 14, the third semiconductor layer 15, the fourth semiconductor layer 17, the fifth semiconductor layer 18 and the sixth semiconductor layer 20 in the groove 26, thereby supporting the second semiconductor layer 14, the fourth semiconductor layer 17 and the sixth semiconductor layer 20 on the semiconductor layer 11 when the first semiconductor layer 13, the third semiconductor layer 15 and the fifth semiconductor layer 18 have been removed. The supporting layer 28 which is formed so as to cover the entire substrate plays the role of suppressing deflection or the like of the second semiconductor layer 14, the fourth semiconductor layer 17 and the sixth semiconductor layer 20 and of keeping the flatness to support the second semiconductor layer 14, the fourth semiconductor layer 17 and the sixth semiconductor layer 20. Therefore, in order to ensure sufficient mechanical strength, the supporting layer 28 has preferably a film thickness of equal to or more than 200 nm. Further, as a material for the supporting layer 28, it is possible to use an insulator such as a silicon oxide film.

However, the second semiconductor layer 14, the fourth semiconductor layer 17 and the sixth semiconductor layer 20 are respectively contacted to the semiconductor substrate 11, the second semiconductor layer 14 and the fourth semiconductor layer 17 so as to respectively cover the first semiconductor layer 13, the third semiconductor layer 15 and the fifth semiconductor layer 18. Therefore, even if the first semiconductor layer 13, the third semiconductor layer 15 and the fifth semiconductor layer 18 are removed, the second semiconductor layer 14, the fourth semiconductor layer 17 and the sixth semiconductor layer 20 can support themselves on the semiconductor substrate 11, so the supporting layer 28 is not necessarily provided.

Figure 9A:
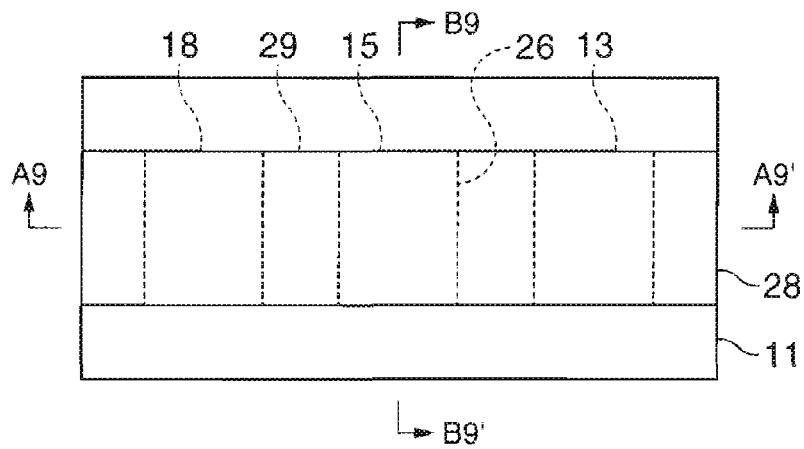
FIGS. 9A-9C are views illustrating a method for manufacturing a semiconductor device according to an embodiment of the present invention.
Figure 9B:
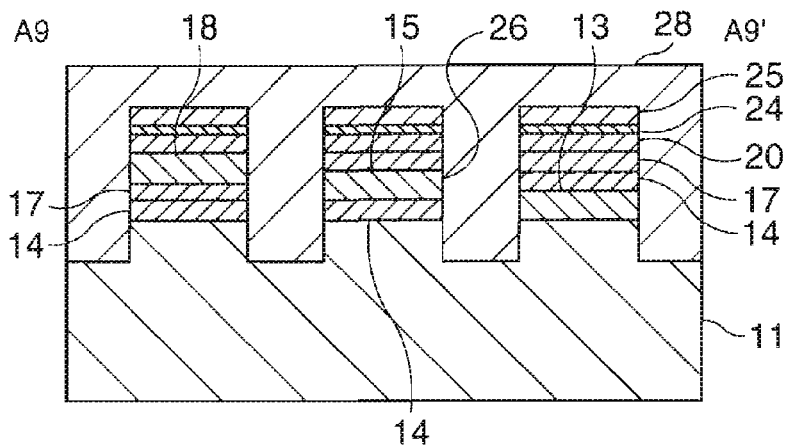
Figure 9C:
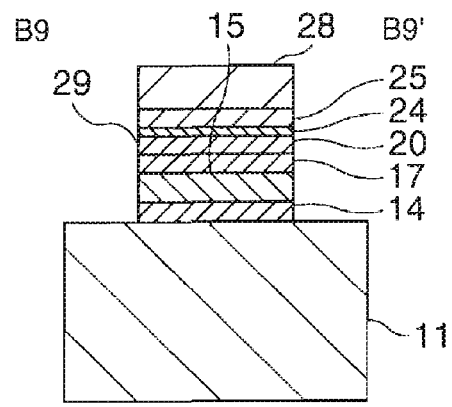

Next, as shown in FIGS. 9A-9C, by patterning the supporting layer 28, the oxidation resistant film 25, the foundation oxide film 24, the first semiconductor layer 13, the second semiconductor layer 14, the third semiconductor layer 15, the fourth semiconductor layer 17, the fifth semiconductor layer 18 and the sixth semiconductor layer 20 by using photolithography technique and etching technique, a groove 29 is formed that exposes a part of the first semiconductor layer 13, the third semiconductor layer 15 and the fifth semiconductor layer 18. Here, the arrangement portion of the groove 29 may correspond to a part of an isolation field region between the second semiconductor layer 14, the fourth semiconductor layer 17 and the sixth semiconductor layer 20 in each region of Ra, Rb, and Rc respectively.

Note that when a part of the first semiconductor layer 13, the third semiconductor layer 15 and the fifth semiconductor layer 18 is to be exposed, it is possible to stop etching at the surface of the first semiconductor layer 13, the third semiconductor layer 15 and the fifth semiconductor layer 18, or it is possible to over etch the first semiconductor layer 13, the third semiconductor layer 15 and the fifth semiconductor layer 18, respectively, thereby forming a concave portion respectively in the first semiconductor layer 13, the third semiconductor layer 15 and the fifth semiconductor layer 18. Alternatively, it is possible to make a thorough hole into the first semiconductor layer 13, the third semiconductor layer 15 and the fifth semiconductor layer 18 in the groove 29, thereby exposing the surface of the semiconductor substrate 11. In this case, by stopping etching of the first semiconductor layer 13, the third semiconductor layer 15 and the fifth semiconductor layer 18 in progress, it becomes possible to prevent the surface of the semiconductor substrate 11 in the groove 29 from being exposed. Therefore, when removing by etching of the first semiconductor layer 13, the third semiconductor layer 15, and the fifth semiconductor layer 18, it becomes possible to reduce the time for which the semiconductor substrate 11 in the groove 29 is exposed to etching solution or etching gas, thereby making it possible to suppress over etching of the semiconductor substrate 11 in the groove 29.

Figure 10A:
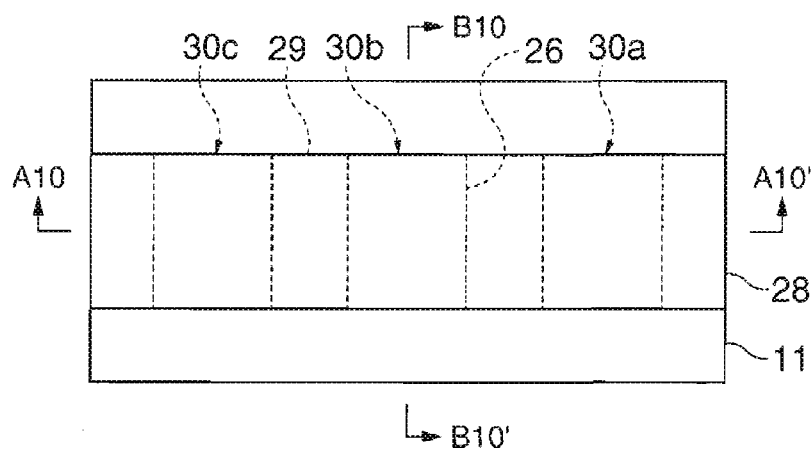
FIGS. 10A-10C are views illustrating a method for manufacturing a semiconductor device according to an embodiment of the present invention.
Figure 10B:
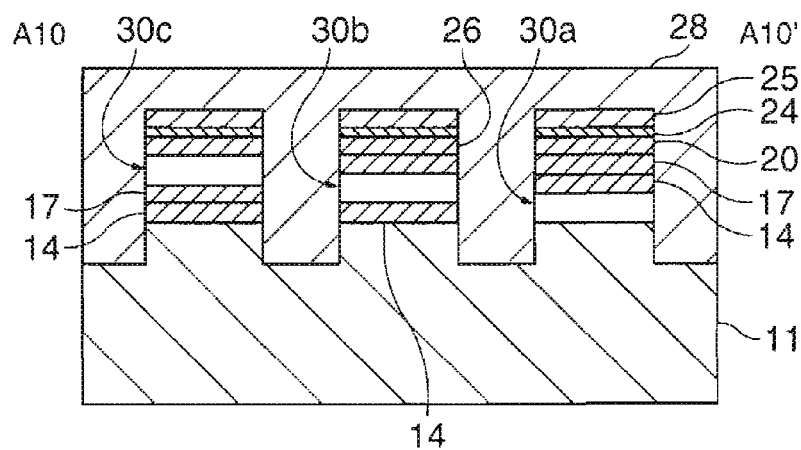
Figure 10C:
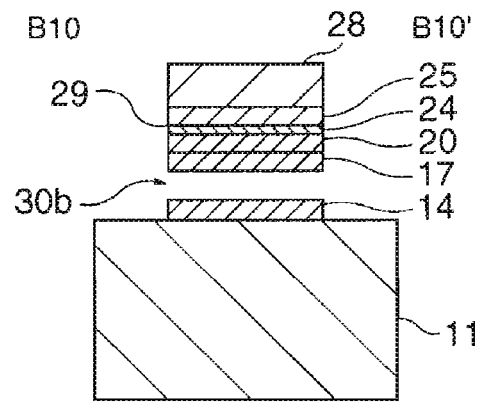

Next, as shown in FIGS. 10A-10C, etching gas or etching solution contacts the first semiconductor layer 13, the third semiconductor layer 15, and the fifth semiconductor layer 18 via the groove 29, thereby removing by etching of the first semiconductor layer 13, the third semiconductor layer 15 and the fifth semiconductor layer 18 to form void portions 30a-30c respectively under the second semiconductor layer 14, the fourth semiconductor layer 17 and the sixth semiconductor layer 20.

In this case, by providing the supporting layer 28 in the groove 26, it becomes possible to support the second semiconductor layer 14, the fourth semiconductor layer 17 and the sixth semiconductor layer 20 on the semiconductor substrate 11 even when the first semiconductor layer 13, the third semiconductor layer 15 and the fifth semiconductor layer 18 have been removed. At the same time, by providing the groove 29 besides the groove 26, it becomes possible to make etching gas or etching solution to contact the first semiconductor layer 13, the third semiconductor layer 15 and the fifth semiconductor layer 20 respectively under the second semiconductor layer 14, the fourth semiconductor layer 17 and the sixth semiconductor layer 20. Therefore, it becomes possible to isolate the second semiconductor layer 14 from semiconductor substrate 11, the fourth semiconductor layer 17 from the second semiconductor layer 14, and the sixth semiconductor layer 20 from the fourth semiconductor layer 17 respectively, without impairing crystal quality of the second semiconductor layer 14, the fourth semiconductor layer 17 and the sixth semiconductor layer 20.

It should be noted that, when the semiconductor substrate 11, the second semiconductor layer 14, the fourth semiconductor layer 17 and the sixth semiconductor layer 20 are Si and the first semiconductor layer 13, the third semiconductor layer 15 and the fifth semiconductor layer 18 are SiGe, fluorine nitrate (mixture of fluorinated acid, nitric acid and water) may preferably be used as etching solution for the first semiconductor layer 13, the third semiconductor layer 15 and the fifth semiconductor layer 18. By this, it becomes possible to suppress over etching of the semiconductor substrate 11, the second semiconductor layer 14, the fourth semiconductor layer 17 and the sixth semiconductor layer 20, and at the same time, to remove the first semiconductor layer 13, the third semiconductor layer 15 and the fifth semiconductor layer 18. Further, it is possible to use as etching solution for the first semiconductor layer 13, the third semiconductor layer 15 and the fifth semiconductor layer 18 fluorine nitrate/hydrogen peroxide mixture, ammonia/hydrogen peroxide mixture, or fluorine acetate/hydrogen peroxide mixture.

Furthermore, before removing by etching of the first semiconductor layer 13, the third semiconductor layer 15 and the fifth semiconductor layer 18, it is the alternative way that the first semiconductor layer 13, the third semiconductor layer 15 and the fifth semiconductor layer 18 are changed as porous by anodic oxidation or the like. It is also possible to make the first semiconductor layer 13, the third semiconductor layer 15 and the fifth semiconductor layer 18 to be amorphous by ion implantation therein. By this, it becomes possible to increase the etching rate of the first semiconductor layer 13, the third semiconductor layer 15 and the fifth semiconductor layer 18 and to enlarge the etching areas of the first semiconductor layer 13, the third semiconductor layer 15 and the fifth semiconductor layer 18.

Figure 11A:
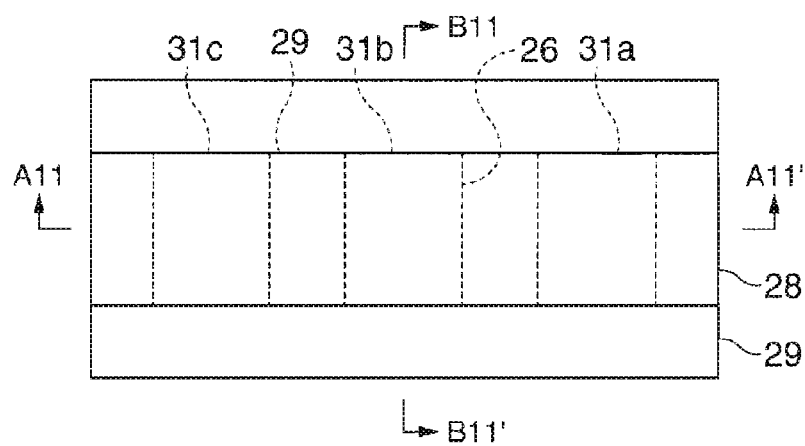
FIGS. 11A-11C are views illustrating a method for manufacturing a semiconductor device according to an embodiment of the present invention.
Figure 11B:
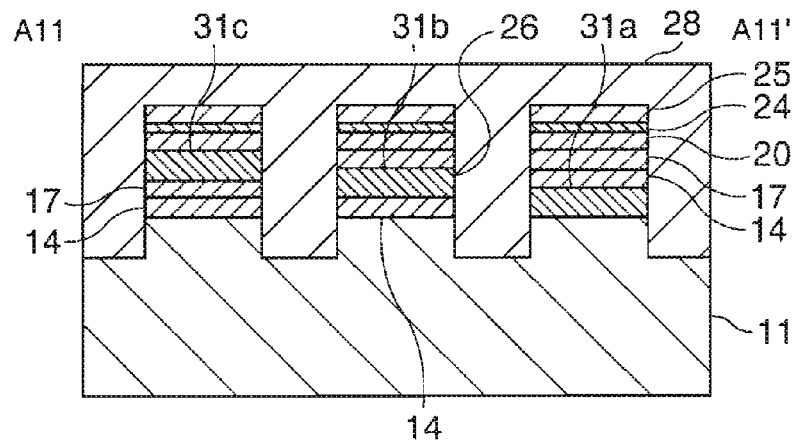
Figure 11C:
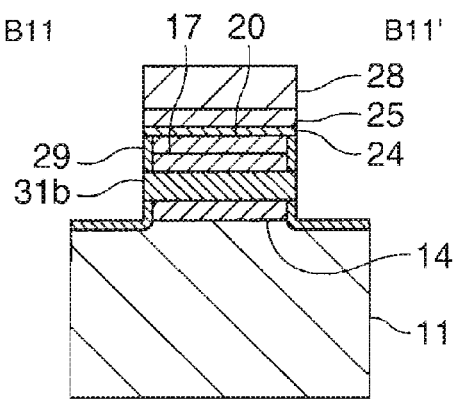

Next, as shown in FIGS. 11A-11C, by thermal oxidation of the semiconductor substrate 11, the second semiconductor layer 14, the fourth semiconductor layer 17 and the sixth semiconductor layer 20, a buried oxide (BOX) layer 31a is formed in the void portion 30a between the semiconductor substrate 11 and the second semiconductor layer 14, a buried oxide (BOX) layer 31b is formed in the void portion 30b between the second semiconductor layer 14 and the fourth semiconductor layer 20, and a buried oxide (BOX) layer 31c is formed in the void portion 30c between the fourth semiconductor layer 17 and the sixth semiconductor layer 20. At that time, the sidewalls of the second semiconductor layer 14, the fourth semiconductor layer 17 and the sixth semiconductor layer 20 are also oxidized.

By this, with regard to the first region Ra, the film thickness of the semiconductor layer on a BOX layer is defined by the entire film thickness of the second semiconductor layer 14, the fourth semiconductor layer 17 and the sixth semiconductor layer 20. With regard to the second region Rb, the film thickness of the semiconductor layer on the BOX layer is defined by the entire film thickness of the fourth semiconductor layer 17 and the sixth semiconductor layer 20. With regard to the third region Rc, the film thickness of the semiconductor layer on the BOX layer is defined by the film thickness of the sixth semiconductor layer 20. Therefore, without using different SOI substrates, it becomes possible to form semiconductor layer having different film thickness respectively on the buried oxide layers 31a-31c.

Note that, when forming the buried oxide layers 31a-31c by thermal oxidation of the semiconductor substrate 11, the second semiconductor layer 14, the fourth semiconductor layer 17 and the sixth semiconductor layer 90, it is preferable to use low-temperature wet oxidation to control reaction rate for buried well. Further, after the oxide layers 31a-31c are respectively formed in the void portions 30a-30c, anneal may be performed at a temperature equal to or more than 1100° C. By this, it becomes possible to make the buried oxide layers 31a-31c to reflow, thereby making it possible to reduce stress of the buried insulating layers 31a-31c, and at the same time, to reduce the interface state at the boundary of the second semiconductor layer 14, the fourth semiconductor layer 17 and the sixth semiconductor layer 20. Furthermore, the buried oxide layers 31a-31c may be so formed as to be buried respectively in the entire void portions 31a-31c, or as to be buried partially in the void portions 30a-30c, respectively.

Moreover, referring to the method shown in FIGS. 11A-11C, it is described to form the buried oxide layers 31a-31c respectively in the void portions 30a-30c by thermal oxidation of the semiconductor substrate 11, the second semiconductor layer 14, the fourth semiconductor layer 17 and the sixth semiconductor layer 20. However, it is also possible to bury the buried insulating layers 31a-31c in the void portions 30a-30c between the semiconductor substrate 11 and the second semiconductor layer 13 by forming an insulating film in the void portion 20 by CVD method. By this, it becomes possible to suppress the reduction in film of the second semiconductor layer 14, the fourth semiconductor layer 17, and the sixth semiconductor layer 20, and to bury materials other than an oxidation film in the void portions 30a-30c. Therefore, it becomes possible to achieve thicker film thickness of the buried insulating layers 31a-31c respectively arranged on the back surfaces of the second semiconductor layer 14, the fourth semiconductor layer 17 and the sixth semiconductor layer 20, while making it possible to reduce dielectric constant, thereby reducing the parasitic capacitance on the back surfaces of the second semiconductor layer 14, the fourth semiconductor layer 17 and the sixth semiconductor layer 20.

It should be noted that as materials for the buried insulating layers 31a-31c, as well as a silicon oxide film, for example, a silicate fluoride glass (FSG) film or a silicon nitride film may be used. Further, it is possible to use for the buried insulating layers 31a-31c, as well as a Spin On Glass (SOG) film, an organic lowk film such as a PSG film, a BPSG film, a poly arylenether (PAE) type film, a hydrogen silsesquioxane (HSQ) type film, a methyl silsesquioxane (MSQ) type film, PCB type film, a CF type film, a SiOC type film, a SiOF type film or a porous film thereof.

By arranging the oxidation resistant film 25 on the sixth semiconductor layer 20, it becomes possible to prevent the thermal oxidation of the surface of the sixth semiconductor layer 20 and to form the buried insulating layers 31a-31c respectively on the back surfaces of the second semiconductor layer 14, the fourth semiconductor layer 17 and the sixth semiconductor layer 20, thereby making it possible to suppress the reduction in film thickness of the sixth semiconductor layer 90.

Further, by making the arrangement portions of the groove 26 and the groove 29 to correspond to the isolation field region of the second semiconductor layer 14, the fourth semiconductor layer 17 and the sixth semiconductor layer 20, it becomes possible to perform isolation of the devices in a lateral direction and a longitudinal direction of the second semiconductor layer 14, the fourth semiconductor layer 17, and the sixth semiconductor layer 20 collectively, while making it possible to omit the need of the supporting layer 28 that supports on the semiconductor substrate 11 the second semiconductor layer 14, the fourth semiconductor layer 17 and the sixth semiconductor layer 20 in an active region. Therefore, it becomes possible to reduce the number of steps and to form a SOI transistor, while making it possible to suppress the increase of the chip size and to reduce costs of the SOI transistor.

Figure 12A:
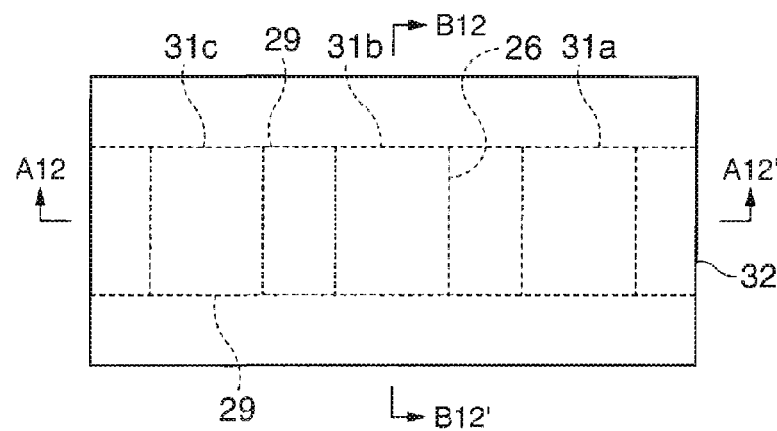
FIGS. 12A-12C are views illustrating a method for manufacturing a semiconductor device according to an embodiment of the present invention.
Figure 12B:
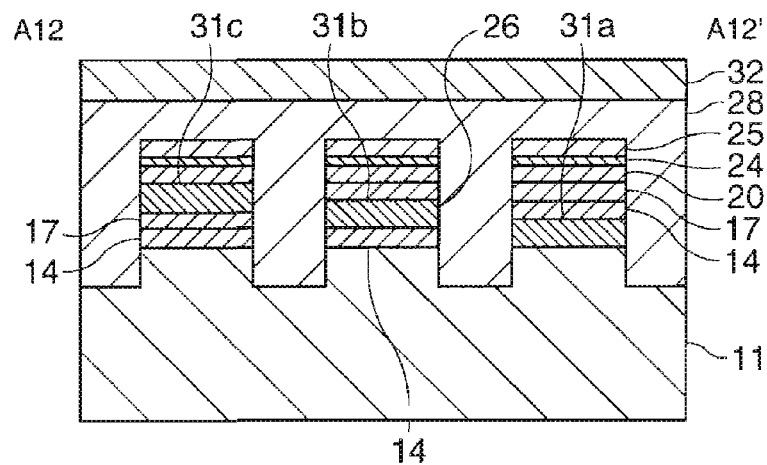
Figure 12C:
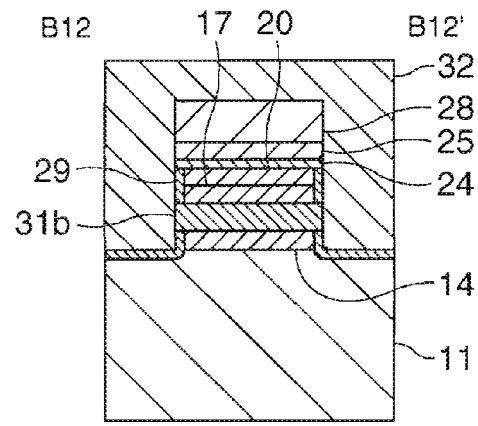

Next, as shown in FIGS. 12A-12C, a buried insulating layer 32 embedded in the groove 29 so as to cover the entire surface of the supporting layer 28 is formed by a method such as CVD.

Figure 13A:
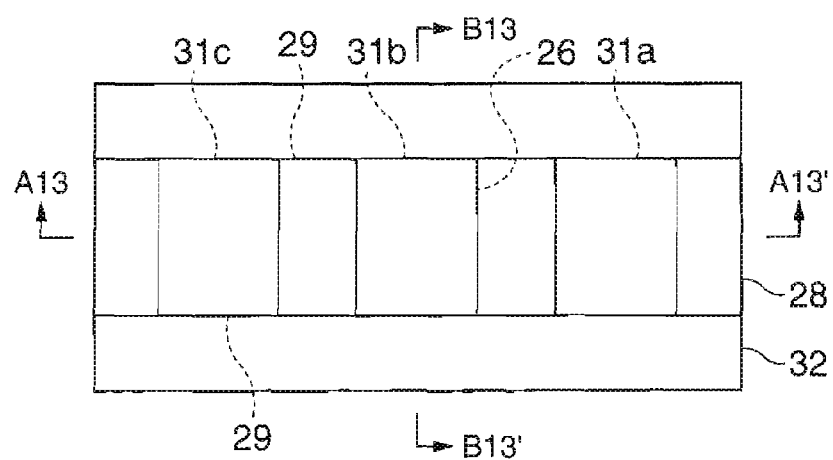
FIGS. 13A-13C are views illustrating a method for manufacturing a semiconductor device according to an embodiment of the present invention.
Figure 13B:
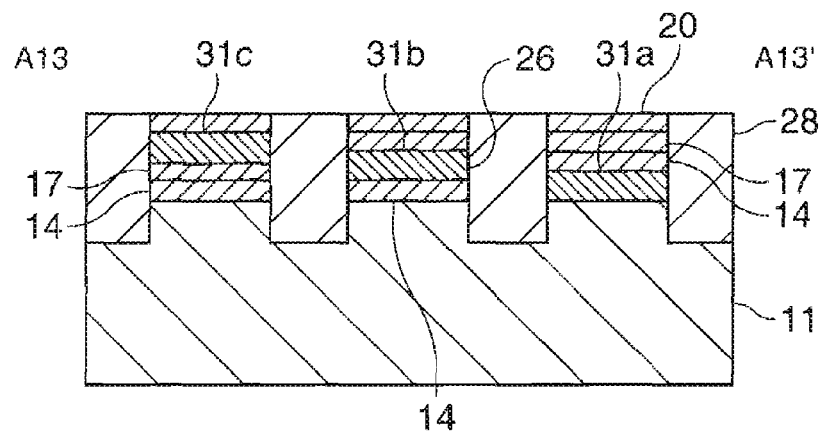
Figure 13C:
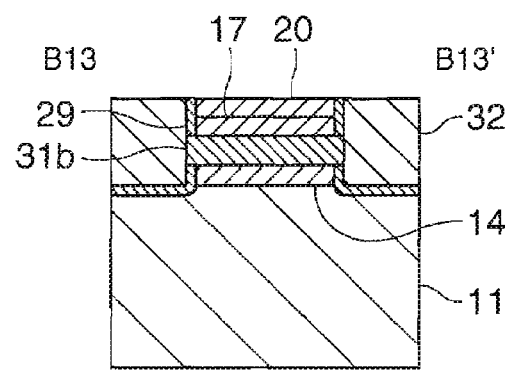

Next, as shown in FIGS. 13A-13C, the buried insulating layer 32 and the supporting layer 28 are reduced in film thickness by a method such as CMP or etch back, and the planarization by CMP is stopped by using the oxidation resistant film 25 as a stopper layer. Next, by removing the foundation oxide film 24 and the oxidation resistant film 25, the surface of the sixth semiconductor layer 20 is made to be exposed.

Figure 14A:
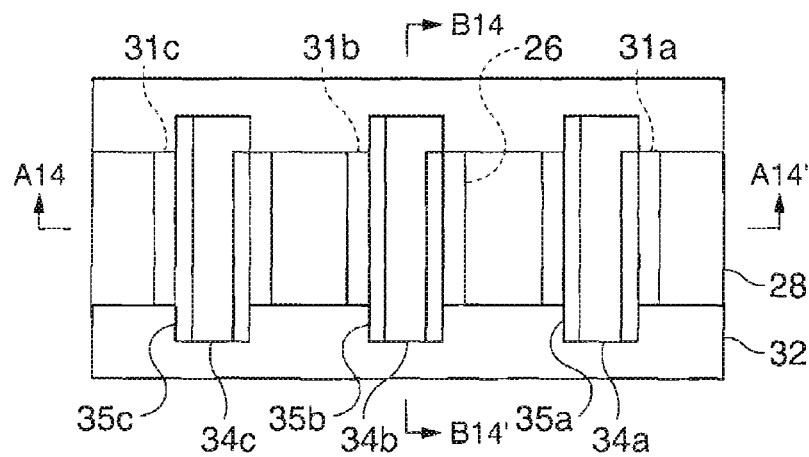
FIGS. 14A-14C are views illustrating a method for manufacturing a semiconductor device according to an embodiment of the present invention.
Figure 14B:
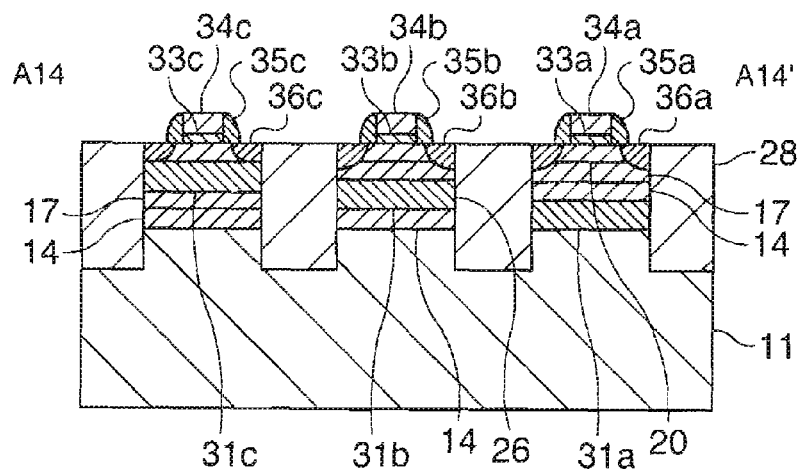
Figure 14C:
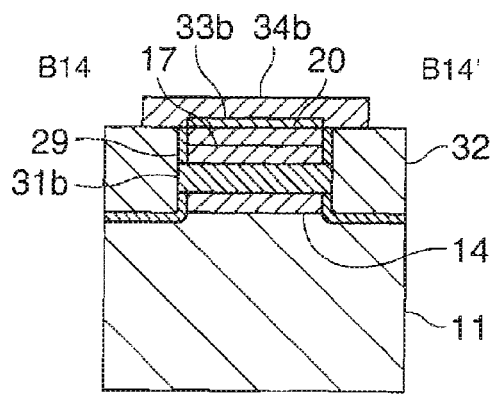

Next, as shown in FIGS. 14A-14C, by thermal oxidation of the surface of the sixth semiconductor layer 20, gate insulating films 33a-33c are respectively formed in the first region Ra, the second region Rb and the third region Rc on the surface of the sixth semiconductor layer 20. Then, a polycrystalline silicon layer is formed on the sixth semiconductor layer having the gate insulating layers 33a-33c formed thereon by a method such as CVD. Then, by patterning the polycrystalline silicon layer by using photo-lithography technique and etching technique, gate electrodes 34a-34c are respectively formed on the gate insulating films 33a-33c.

Next, impurities such as As, P, B and the like are implanted into the sixth semiconductor layer 20 by using the gate electrodes 34a-34c as masks, thereby forming an LDD region formed of an impurity introduction region of low density arranged on the either side of the gate electrodes 34a-34c on the sixth semiconductor layer 20. Then, an insulating layer is formed on the sixth semiconductor layer having the LDD layer formed thereon by a method such as CVD, and the insulating layer is subjected to etch back by using anisotropic etching such as RIE, thereby forming side walls 35a-35c respectively on the side walls of the gate electrodes 34a-34c. After that, by ion-implantation of impurities such as As, P, B and the like into the second semiconductor layer 14, the fourth semiconductor layer 17 and the sixth semiconductor layer 20 by using as masks the gate electrodes 34a-34c and the side walls 35a-35c, source/drain layers 36a-36c formed of an impurity introduction region of high density respectively arranged to be lateral to the side walls 35a-35c are formed on the second semiconductor layer 14, the fourth semiconductor layer 17 and the sixth semiconductor layer 20, respectively. In this case, a high breakdown voltage MOS transistor can be formed in the first region Ra, a partially depleted SOI transistor can be formed in the second region Rb, and a fully depleted SOI transistor can be formed in the third region Rc.

By this, it becomes possible to make the depth of the buried insulating layers 31a-31c arranged under the semiconductor layer to be different in different places on the same semiconductor substrate 11. Therefore, it becomes possible to form semiconductor layers having different film thickness on the buried insulating layers 31a-31c without using different SOI substrates, and to achieve reduction in cost of transistors while making it possible to place on the same chip SOI transistors which correspond to the applications of low voltage driving, low power consumption, high breakdown voltage, high speed and the like in a mixed manner.

Figure 15A:
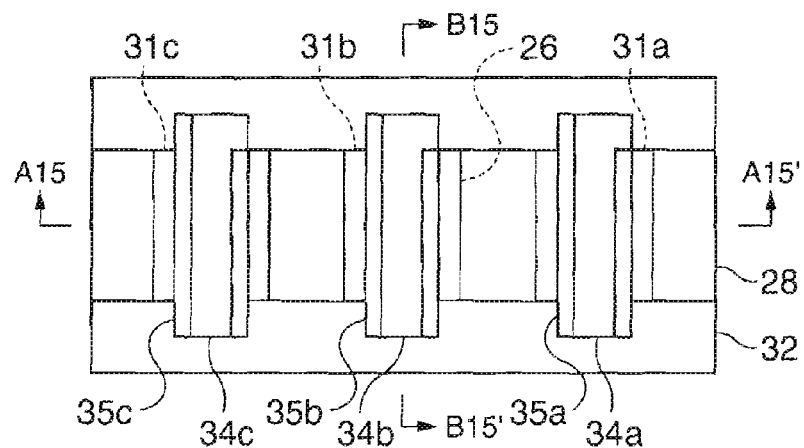
FIGS. 15A-15C are views illustrating a semiconductor device according to an embodiment of the present invention.
Figure 15B:
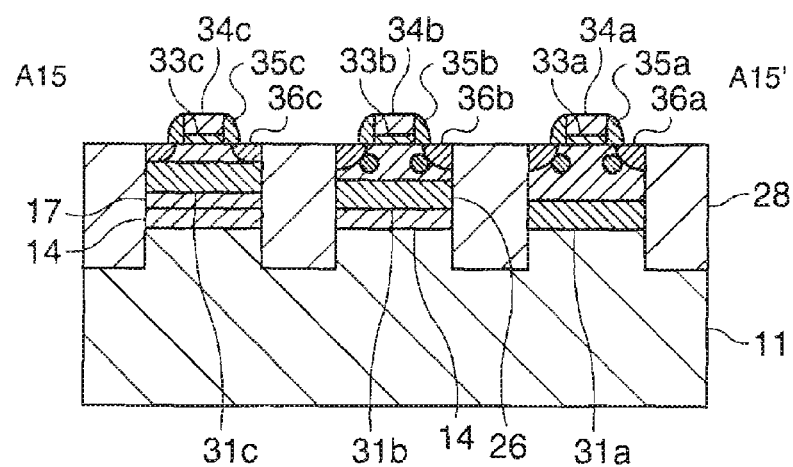
Figure 15C:
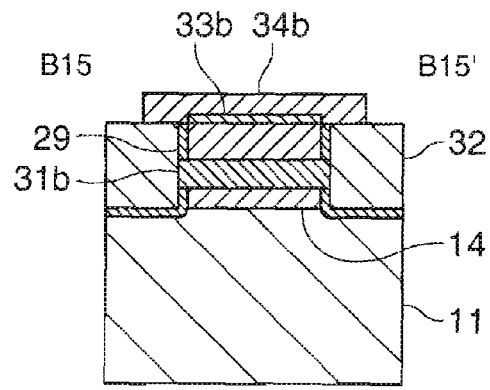

Furthermore, a modification of the above-mentioned embodiment is shown in FIGS. 15A-15C. As described above, the semiconductor layer 14, the fourth semiconductor layer 17, the sixth semiconductor layer 20 are of the same composition, therefore they are shown as one layer. In this case, there are provided impurity regions of high density directly under the LDD region in order to prevent deterioration in breakdown such as punch thorough phenomena respectively for the high breakdown MOS transistor formed in the first region Ra, and the partially depleted SOI transistor. Those regions are also referred to as a stopper region, a Halo region, or a Pocket region. By this, even when a high voltage is applied to the drain region, good transistor properties without leakage current can be obtained.

With reference to the above embodiment, a method for forming the oxidation resistant film 25 on the sixth semiconductor layer 20 in order to prevent the thermal oxidation of the surface of the sixth semiconductor layer 20 when forming the buried oxide layer 31a-31c has been described. However, it is possible to form the buried insulating layers 31a-31c without forming the oxidation resistant film 25 on the sixth semiconductor layer 20. In this case, the insulating film formed on the surface of the sixth semiconductor layer 20 may be removed by etching or polishing before forming the buried insulating layers 31a-31c.

Further, referring to the above-described embodiment a method for forming three semiconductor layers having different film thicknesses arranged on the buried insulating layer has been described. However, it is possible to form two semiconductor layers having different film thicknesses arranged on the buried insulating layer or to form more than four semiconductor layers having different film thicknesses arranged on the buried insulating layer.

What is claimed is:

1. A semiconductor device, comprising:
    a semiconductor layer formed above a semiconductor substrate;
    a source or drain region formed within the semiconductor layer;
    a first buried insulating layer formed under the semiconductor layer; and
    a second buried insulating layer formed under the first buried insulating layer,
    wherein the first buried insulating layer and the second buried insulating layer are formed between the source or drain region and the semiconductor substrate in a sectional view,
    wherein the first buried insulating layer and the second buried insulating layer do not overlap each other in plan view, and
    wherein another semiconductor layer is sandwiched between and in direct contact with both the first buried insulating layer and the semiconductor substrate.

2. The semiconductor device according to claim 1, further comprising:
    an isolation field region, the isolation field region being formed between a first part of the semiconductor layer on the first buried insulating layer and a second part of the semiconductor layer on the second buried insulating layer in a horizontal direction.

3. A semiconductor device, comprising:
    a first semiconductor layer formed above a semiconductor substrate;
    a second semiconductor layer formed above the first semiconductor layer;
    a source or drain region formed above the semiconductor substrate;
    a first buried insulating layer formed between the semiconductor substrate and the first semiconductor layer; and
    a second buried insulating layer formed between the first semiconductor layer and the second semiconductor layer, wherein the first buried insulating layer and the second buried insulating layer are formed between the source or drain region and the semiconductor substrate in a sectional view, wherein the first buried insulating layer and the second buried insulating layer do not overlap each other in plan view, and wherein the second buried insulating layer is sandwiched between and in direct contact with both the first semiconductor layer and the second semiconductor layer.

4. The semiconductor device according to claim 3, further comprising:

an isolation film, the isolation film being formed between a third part of the first semiconductor layer and a fourth part of the second semiconductor layer on the second buried insulating layer in a horizontal direction.

* * * * *